US 6,635,957 B2

(12) United States Patent
Kwan et al.

(10) Patent No.: US 6,635,957 B2
(45) Date of Patent: Oct. 21, 2003

(54) LEADLESS PLASTIC CHIP CARRIER WITH ETCH BACK PAD SINGULATION AND DIE ATTACH PAD ARRAY

(75) Inventors: Kin Pui Kwan, Kowloon (HK); Wing Him Lau, Yuen Long (HK); Kwok Cheung Tsang, Fauling (HK); Chun Ho Fan, Shamtseng (HK); Neil Mclellan, Branksom (HK)

(73) Assignee: ASAT Ltd., Tsuen Wan (HK)

( * ) Notice: Subject to any disclaimer, the term of this patent is extended or adjusted under 35 U.S.C. 154(b) by 203 days.

(21) Appl. No.: 09/802,679

(22) Filed: Mar. 9, 2001

(65) Prior Publication Data

US 2001/0014538 A1 Aug. 16, 2001

Related U.S. Application Data (63) Continuation-in-part of application No. 09/288,352, filed on Apr. 8, 1999, now Pat. No. 6,498,099, which is a continuation-in-part of application No. 09/095,803, filed on Jun. 10, 1998, now Pat. No. 6,229,200.

(51) Int. Cl.[7] .......................... H01L 23/52; H01L 23/28
(52) U.S. Cl. ...................... 257/691; 257/693; 257/773; 257/762; 257/787; 257/793
(58) Field of Search .............................. 257/691, 693, 257/666, 773, 762, 787, 793

(56) References Cited

U.S. PATENT DOCUMENTS

| 4,530,152 A | | 7/1985 | Roche et al. | |
|---|---|---|---|---|
| 5,066,831 A | * | 11/1991 | Spielberger et al. | 361/412 |
| 5,293,072 A | * | 3/1994 | Tsuji et al. | 257/737 |
| 5,444,301 A | * | 8/1995 | Song et al. | 257/737 |
| 5,457,340 A | | 10/1995 | Templeton, Jr. et al. | |
| 5,710,695 A | | 1/1998 | Manteghi | |
| 5,777,382 A | * | 7/1998 | Abbott et al. | 257/695 |
| 5,976,912 A | | 11/1999 | Fukutomi et al. | |
| 6,001,671 A | | 12/1999 | Fjelstad | |
| 6,057,601 A | * | 5/2000 | Lau et al. | 257/730 |
| 6,194,786 B1 | * | 2/2001 | Orcutt | 257/780 |
| 6,294,830 B1 | * | 9/2001 | Fjelstad | 257/724 |
| 6,459,163 B1 | * | 10/2002 | Bai | 257/787 |

FOREIGN PATENT DOCUMENTS

JP    Sho 59-208756    11/1984

* cited by examiner

Primary Examiner—Jasmine Clark
(74) Attorney, Agent, or Firm—Keating & Bennett, LLP (57) ABSTRACT

A leadless plastic chip carrier has a plurality of die attach pads on which a singulated semi-conductor die is mounted. At least one row of contact pads circumscribes the plurality of die attach pads and a power/ground ring is intermediate the contact pads and the die attach pads. Wire bonds connect the semiconductor die, the contact pads and the power/ground ring. An overmold covers the semiconductor die, the die attach pads, the power/ground ring and the contact pads such that each of the die attach pads and the contact pads has one exposed surface.

13 Claims, 10 Drawing Sheets

Step 1: Raw material (Cu Panel)

FIG. 1A

Step 2: Solder mask coating

FIG. 1B

Step 3: UV exposure with phototool

FIG. 1C

Step 4: Developing

FIG. 1D

Step 5: Metal Plating

FIG. 1E

Step 6: Die Attach

FIG. 1F

Step 7: Wire bonding and molding

FIG. 1G

Step 8: Alkaline etching

FIG. 1H

Step 9: Singulation

FIG. 1I

Step 1: Raw material (Cu Panel)

FIG. 2A

Step 2: Photo-resist coating

FIG. 2B

Step 3: UV exposure with phototool

FIG. 2C

Step 4: Developing

FIG. 2D

Step 5: Metal Plating

FIG. 2E

Step 6: Stripping

FIG. 2F

Step 7: Soldermask coating

FIG. 2G

Step 8: UV exposure with photo tool

FIG. 2H

Step 9: Developing

FIG. 2I

Step 10: Die Attach

FIG. 2J

Step 11: Wire bonding, molding, etching and singulation

FIG. 2K

Step 1: Raw material (Cu Panel)

FIG. 3A

Step 2: Photo-resist coating

FIG. 3B

Step 3: UV exposure with phototool

FIG. 3C

Step 4: Developing

FIG. 3D

Step 5: Metal Plating

FIG. 3E

Step 6: Stripping

FIG. 3F

Step 7: Soldermask coating

FIG. 3G

Step 8: UV exposure with photo tool

FIG. 3H

Step 9: Developing

FIG. 3I

Step 10: Die Attach

FIG. 3J

Step 11: Wire bonding, molding, etching and singulation

LEADLESS PLASTIC CHIP CARRIER WITH ETCH BACK PAD SINGULATION AND DIE ATTACH PAD ARRAY

CROSS-REFERENCE TO RELATED APPLICATION

This is a continuation-in-part of U.S. patent application Ser. No. 09/288,352, now U.S. Pat. No. 6,498,099 filed Apr. 8, 1999, which is a continuation-in-part of U.S. patent application Ser. No. 09/095,803, filed Jun. 10, 1998 now U.S. Pat. No. 6,229,200.

FIELD OF THE INVENTION

The present invention relates in general to integrated circuit packaging, and more particularly to an improved process for fabricating a leadless plastic chip carrier which includes a post mold etch back step and a unique die attach pad design.

BACKGROUND OF THE INVENTION

According to well known prior art IC (integrated circuit) packaging methodologies, semiconductor dice are singulated and mounted using epoxy or other conventional means onto respective die pads (attach paddles) of a leadframe strip. Traditional QFP (Quad Flat Pack) packages incorporate inner leads which function as lands for wire bonding the semiconductor die bond pads. These inner leads typically require mold locking features to ensure proper positioning of the leadframe strip during subsequent molding to encapsulate the package. The inner leads terminate in outer leads that are bent down to contact a mother board, thereby limiting the packaging density of such prior art devices.

In order to overcome these and other disadvantages of the prior art, the Applicants previously developed a Leadless Plastic Chip Carrier (LPCC). According to Applicants' LPCC methodology, a leadframe strip is provided for supporting up to several hundred devices. Singulated IC dice are placed on the strip die attach pads using conventional die mount and epoxy techniques. After curing of the epoxy, the dice are gold wire bonded to peripheral internal leads. The leadframe strip is then molded in plastic or resin using a modified mold wherein the bottom cavity is a flat plate. In the resulting molded package, the die pad and leadframe inner leads are exposed. By exposing the bottom of the die attach pad, mold delamination at the bottom of the die paddle is eliminated, thereby increasing the moisture sensitivity performance. Also, thermal performance of the IC package is improved by providing a direct thermal path from the exposed die attach pad to the motherboard. By exposing the leadframe inner leads, the requirement for mold locking features is eliminated and no external lead standoff is necessary, thereby increasing device density and reducing package thickness over prior art methodologies. The exposed inner leadframe leads function as solder pads for motherboard assembly such that less gold wire bonding is required as compared to prior art methodologies, thereby improving electrical performance in terms of board level parasitics and enhancing package design flexibility over prior art packages (i.e. custom trim tools and form tools are not required). These and several other advantages of Applicants' own prior art LPCC process are discussed in Applicants' co-pending patent application Ser. No. 09/095,803, the contents of which are incorporated herein by reference.

Applicants' LPCC production methodology utilizes saw singulation to isolate the perimeter I/O row as well as multi-row partial lead isolation. Specifically, the leadframe strip is mounted to a wafer saw ring using adhesive tape and saw-singulated using a conventional wafer saw. The singulation is guided by a pattern of fiducial marks on the bottom side of the leadframe strip. Also, special mold processing techniques are used to prevent the mold flow from bleeding onto the functional pad area and inhibiting electrical contact. Specifically, the exposed die pad surface is required to be deflashed after molding to remove any molding compound residue and thereby allow the exposed leads and die attach pad to serve as solder pads for attachment to the motherboard.

According to Applicants' co-pending U.S. patent application Ser. No. 09/288,352, the contents of which are incorporated herein by reference, an etch back process is provided for the improved manufacture of the LPCC IC package. The leadframe strip is first subjected to a partial etch on one or both of the top and bottom surfaces in order to create a pattern of contact leads (pads) and a die attach pad (paddle). After wire bonding the contacts to a singulated semiconductor die, followed by overmolding and curing of the mold, the leadframe strip is exposed to a second full etch immersion for exposing the contact pads in an array pattern (i.e. multi-row) or perimeter pattern (i.e. single row), as well as the die attach pad. In the case of a package with multi-row I/O leads, this etch back step eliminates the requirement for two additional saw singulation operations (i.e. to sever the inner leads from the outer leads), and in both the single-row and multi-row configurations, the etch back step eliminates post mold processing steps (e.g. mold deflashing) and ensures superior device yield over the processing technique set forth in Applicants' prior application Ser. No. 09/095,803. Additionally, using this technique allows for higher I/O pad density and also allows for pad standoff from the package bottom which reduces stress in the solder joint during PCB temp cycling. Further, the technique allows for the use of a pre-singulation strip testing technique given that the electrical I/O pads are now isolated from each other and testing in strip can take place. This feature greatly increased the handling and throughput of the test operation.

In Applicant's co-pending U.S. application for a Leadless Plastic Chip Carrier With Etch Back Pad Singulation, filed concurrently herewith, the contents of which are incorporated herein by reference, the etch-back LPCC process of Applicants' co-pending U.S. patent application Ser. No. 09/288,352 is modified to provide additional design features.

The leadframe strip is selectively covered with a thin layer photo-resist mask in predetermined areas. Following the application of the mask, an etch-barrier is deposited as the first layer of the contact pads and die attach pad, followed by several layers of metals which can include for example, Ni, Cu, Ni, Au, and Ag. This method of formation of the contact pads allows plating of the pads in a columnar shape and into a "mushroom cap" or rivet-shape as it flows over the photoresist mask. The shaped contact pads are thereby locked in the mold body, providing superior board mount reliability. Similarly, the die attach pad can be formed in an interlocking shape for improved alignment with the die. The photo-resist mask is then rinsed away and the semiconductor die is mounted to the die attach pad. This is followed by gold wire bonding between the semiconductor die and the peripheral contact pads and then molding as described in Applicant's application Ser. No. 09/095,803. The leadframe is then subjected to full immersion in an alkaline etchant that exposes a lower surface of an array of the contact pads, a power ring and the die attach pad, followed by singulation of the individual unit from the full leadframe array strip.

During mounting of the integrated circuit package to a printed circuit board, solder alloy on the exposed contact pads and die attach pad tend to ball up due to surface tension that can cause the integrated circuit package to lift away from the circuit board, from the center. In the case where the die attach pad is much larger than the contact pads, solder fillet of the contact pad can be weakened or broken.

SUMMARY OF THE INVENTION

According to an aspect of the present invention, a new leadless plastic chip carrier is provided. The leadless plastic chip carrier has a plurality of die attach pads on which a singulated semi-conductor die is mounted. At least one row of contact pads circumscribes the plurality of die attach pads and a power/ground ring is intermediate the contact pads and the die attach pads. Wire bonds connect the semiconductor die, the contact pads and the power/ground ring. An overmold covers the semiconductor die, the attach pads, the power/ground ring and the contact pads such that each of the die attach pads and the contact pads has one exposed surface. According to a further aspect of the invention, each of the plurality of die attach pads are separated by a photo-imageable mask. The plurality of die attach pads reduces the maximum stress created as a result of the mismatch of thermal expansion coefficients between the die and the die attach pads when compared to the stress created when employing a single, larger die attach pad.

According to another aspect of the present invention, a new process for fabricating a leadless plastic chip carrier is provided. The process has the steps of: depositing a photo-imageable mask on a first surface of a leadframe strip; imaging and developing the mask to define a plurality of die attach pads, at least one row of contact pads and a power/ground ring intermediate the die attach pads and the contact pads; depositing a plurality of layers on portions of the first surface exposed by the imaging and the developing for creating the at least one row of contact pads, the power/ground ring and the plurality of die attach pads; mounting the semi-conductor die to the die attach pads on a top surface thereof; wire bonding the semiconductor die to the contact pads; encapsulating the mask, the layers, and the die between a moulding compound and the first surface of the leadframe strip; etching back a bottom surface of the leadframe strip for exposing the contact pads and the die attach pads; and singulating the leadless plastic chip carrier from the leadframe strip.

According to yet another aspect of the present invention, a new process for fabricating a leadless plastic chip carrier is provided. The process having the steps of: applying a layer of photo-resist on a first surface of a leadframe strip; exposing and developing the layer of photo-resist to define a plurality of die attach pads, at least one row of contact pads and a power/ground ring intermediate the die attach pads and the contact pads between a remainder of the photo-resist; depositing a plurality of layers on portions of the first surface exposed by the exposing and the developing for creating the at least one row of contact pads, the power/ground ring and the plurality of die attach pads; stripping the remainder of the photo-resist; depositing a photo-imageable mask on the first surface and the plurality of die attach pads; imaging and developing the mask to expose a top surface of the plurality of die attach pads; mounting the semiconductor die to the die attach pads on the top surface; wire bonding the semiconductor die to the contact pads; encapsulating the mask, the layers, and the die between a moulding compound and the first surface of the leadframe strip; etching back a bottom surface of the leadframe strip for exposing the contact pads and the die attach pads; and singulating the leadless plastic chip carrier from the leadframe strip It is an advantage of an aspect of the present invention to mitigate internal stress between the die and the die attach pad resulting from differences in the coefficient of thermal expansion.

It is a further advantage of an aspect of the present invention to simplify printed circuit board assembly mounting. Providing an array of die attach pads rather than a single large die attach pad reduces lifting of the integrated circuit package caused by surface tension of the solder. Also, edge surface tension aids in self-alignment of the integrated circuit package on assembly with the printed circuit board. The force caused by edge surface tension is greater with an array of smaller pads rather than a single large pad.

BRIEF DESCRIPTION OF THE DRAWINGS

The invention will be better understood with reference to the drawings in which.

DETAILED DESCRIPTION OF THE PREFERRED EMBODIMENT

The present invention relates to an improvement over Applicant's co-pending application for a Leadless Plastic Chip Carrier With Etch Back Pad Singulation (LPCCEBS), filed concurrently herewith. Where possible, the same reference numerals have been used in this application to denote identical features described in Applicant's above-noted LPCCEBS application.

Figure 1A:
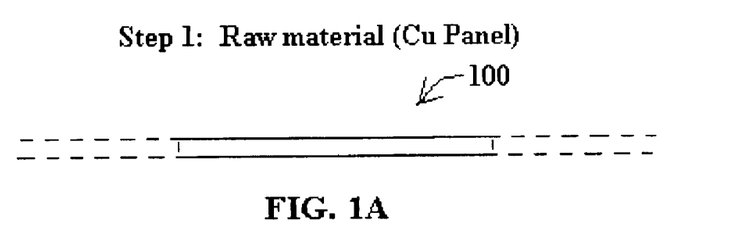
FIGS. 1A–1I show processing steps for manufacturing a Leadless Plastic Chip Carrier (LPCC) with etch back and a plurality of die attach pads according to an embodiment of the present invention.

Referring to FIG. 1A, an elevation view is provided of a Cu (copper) panel substrate which forms the raw material of the leadframe strip indicated generally by the numeral 100. As discussed in greater detail in Applicants' co-pending application Ser. No. 09/095,803, the leadframe strip 100 is divided into a plurality of sections, each of which incorporates a plurality of leadframe units in an array (e.g. 3×3 array, 5×5 array, etc.). Only one such unit is depicted in the elevation view of FIG. 1A, portions of adjacent units being shown by stippled lines.

Figure 1B:
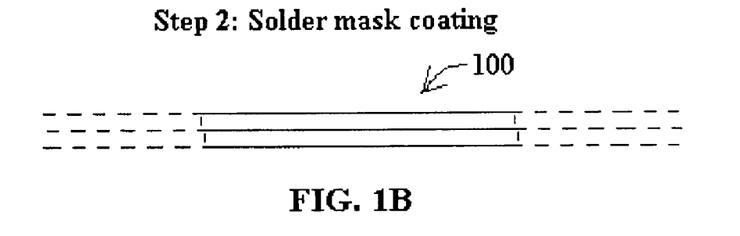

Referring to FIG. 1B, an upper surface of the leadframe strip 100 is coated with a layer of photo-imageable solder mask such as a photo-imageable epoxy.

Figure 1C:
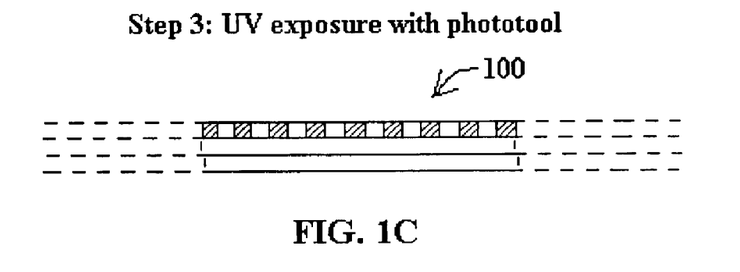
Figure 1D:
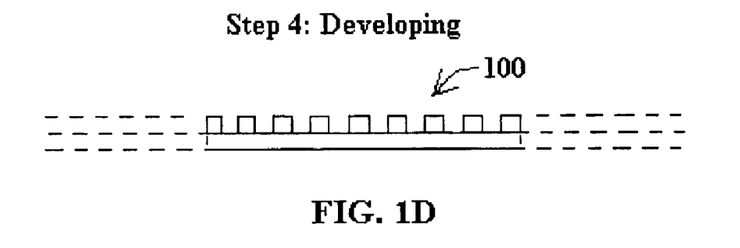

Next, the layer of photo-imageable solder mask is imaged with a photo-tool. This is accomplished by exposure of the photo-imageable solder mask to ultraviolet light masked by the photo-tool, as shown in FIG. 1C, and subsequent developing of the solder-mask, as shown in FIG. 1D. The solder mask is thereby patterned to provide pits in which an upper surface of the Cu substrate is exposed.

Figure 1E:
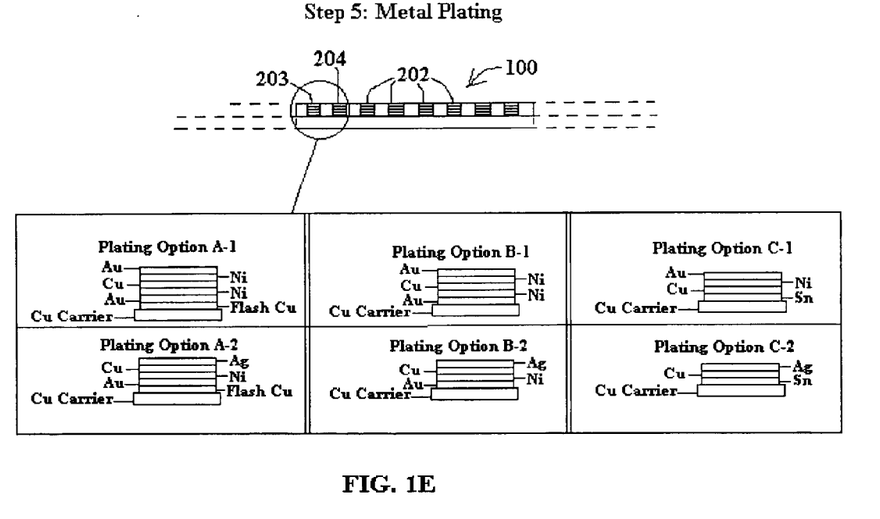

As shown in FIG. 1E, several layers of metals are deposited on the upper surface of the exposed copper substrate to form a plurality of die attach pads 202, a plurality of contact pads 203 and a power or ground ring 204. Different deposition options are provided.

According to options A-1 and A-2, a layer of flash Cu (for example, 50 microinches) is provided over the Cu substrate for creating an etch down cavity following post etching as will be discussed further below. The etch down cavity for attaching solder balls will also be discussed further below. An etch barrier layer of Au (gold) (for example, 20 microinches) is then deposited, followed by layers of Ni (nickel) (for example, 40 microinches) and Cu (3–4 mils). According to option A-1, final layers of Ni (for example, 40 microinches) and Au (for example, 20 microinches) are deposited whereas in Option A-2 a final layer of Ag (silver) is deposited (for example, 100–300 microinches).

In plating Options B-1 and B-2, the initial flash Cu deposition is omitted and the layer of etch barrier Au is deposited directly on the Cu substrate. The Au layer is followed by layers of Ni, Cu, Ni, and Au in Option B-1 and Ni, Cu, and Ag in option B-2.

In Options C-1 and C-2 the etch barrier of Au and subsequent Ni deposition are replaced by an etch barrier of Sn (for example, 100–300 microinches) deposited on the Cu substrate. The Sn layer is followed by layers of Cu, Ni and Au in option C-1 and Cu and Ag in option C-2.

Figure 1F:
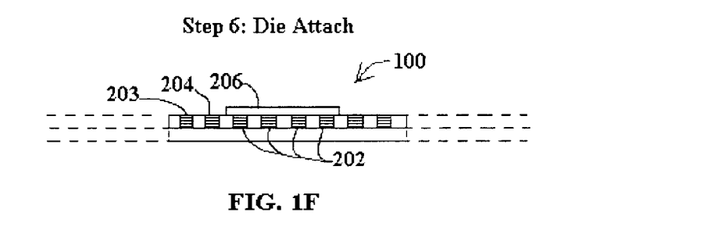

Referring now to FIG. 1F, a singulated semiconductor die 206 is conventionally mounted via epoxy (or other suitable means) to the plurality of die attach pads 202, and the epoxy is cured. Note that in Applicant's Leadless Plastic Chip Carrier With Etch Back Pad Singulation, filed concurrently herewith, a single die attach pad was formed. A plurality of die attach pads 202 such as an array of smaller pads can result in reduced maximum stresses caused by the difference in thermal expansion coefficients between the die 206 and the die attach pads 202 as compared to those stresses resulting from a the single, larger die attach pad.

Figure 1G:
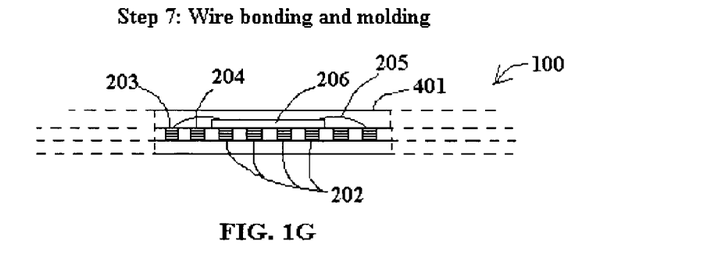

Gold wires 205 are then bonded between the semiconductor die 206 and the contact pads 203. The leadframe 100 is then molded using a modified mold with the bottom cavity being a flat plate, and subsequently cured, as discussed in Applicants' application Ser. No. 09/095,803. The leadframe 100 after the foregoing steps is shown in FIG. 1G, which includes overmold 401 of cured plastic or epoxy (0.8 mm).

The leadframe 100 is then subjected to a final alkaline etching via full immersion which exposes an array of exposed contact pads 203, power/ground ring 204 and the die attach pads 202 shown in FIG. 1I-1. According to Option A, the etch down cavity is left after etching away the flash Cu. This cavity is used for attachment of the solder balls to the contact pads 203.

Figure 1H:
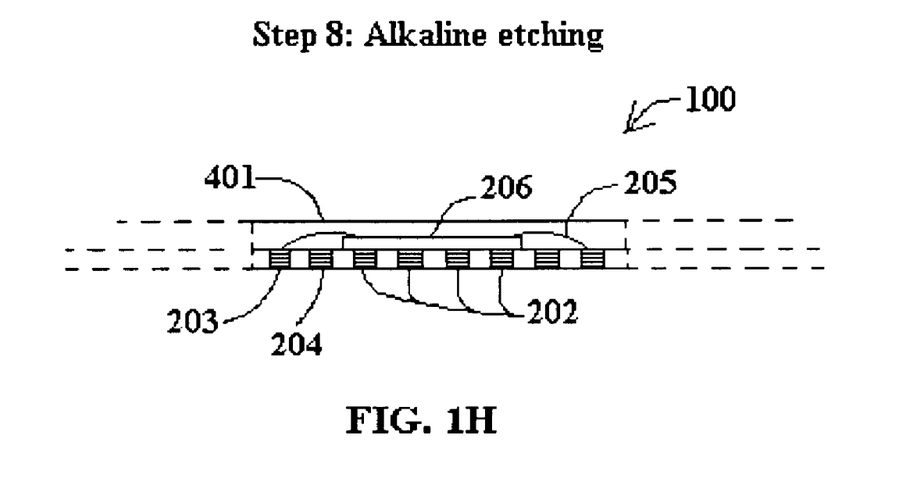

At this stage of manufacture, the power/ground ring 204 and the die attach pads 202 are fully isolated and exposed.

Figure 1I:
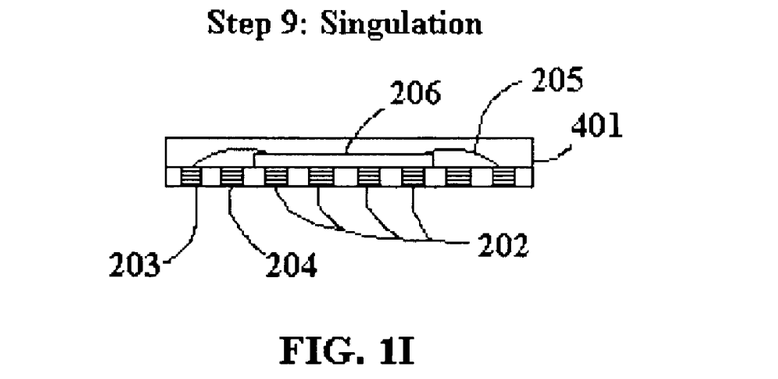

Singulation of the individual units from the full leadframe array strip 100 may then be performed either by saw singulation or die punching resulting in the final configuration of FIG. 1I. Since the entire LPCC contains short circuit connections prior to singulation, it is contemplated that the multiple circuits may be gang tested before singulation.

Referring now to FIGS. 2A–2K, there is provided processing steps for manufacturing a LPCC with etch back and a plurality of die attach pads according to another embodiment of the present invention.

Figure 2A:
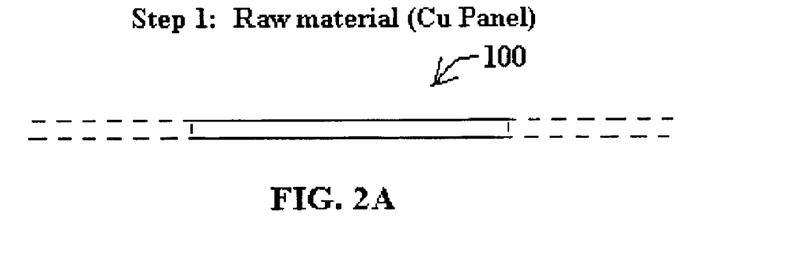
FIGS. 2A–2K show processing steps for manufacturing a Leadless Plastic Chip Carrier (LPCC) with etch back and a plurality of die attach pads according to another embodiment of the present invention.

Referring to FIG. 2A, similar to FIG. 1A, an elevation view is provided of a Cu panel substrate of the leadframe strip indicated generally by the numeral 100. Again, only one such unit is depicted in the elevation view of FIG. 2A, portions of adjacent units being shown by stippled lines.

Figure 2B:
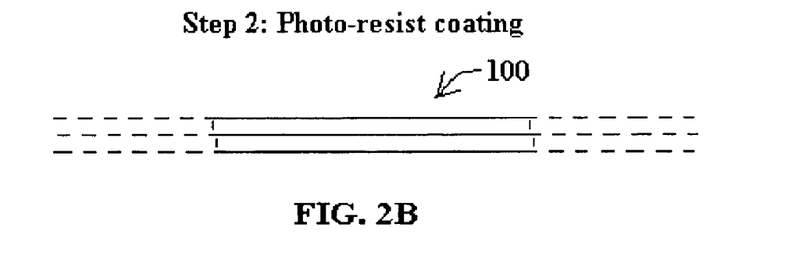
Figure 2C:
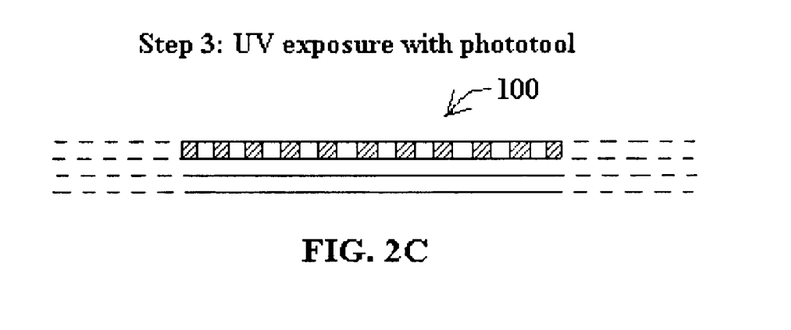
Figure 2D:
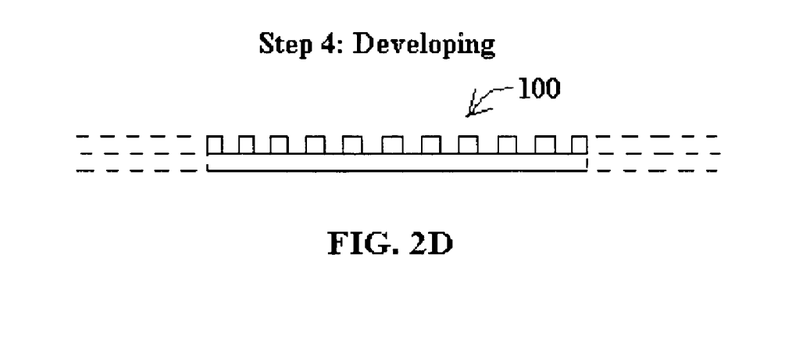

Next, rather than coating with a layer of photo-imagable solder mask, a dry film layer of photo-resist is applied to the upper surface of the lead frame strip, as shown in FIG. 2B. The photo-resist is then patterned with ultraviolet light exposure through a photo-tool as shown in FIG. 2C. FIG. 2D shows the patterned photoresist after developing. The photoresist thereby provides pits in which an upper surface of the Cu substrate is exposed.

Figure 2E:
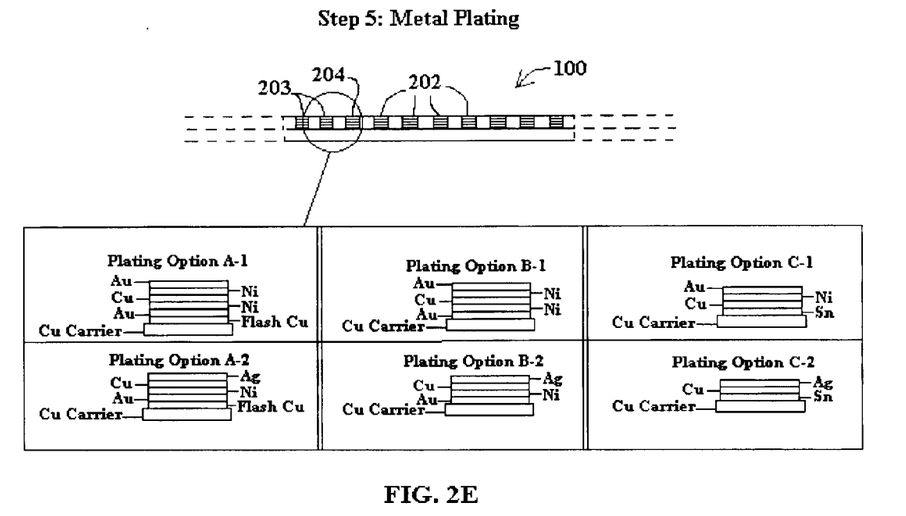
Figure 2F:
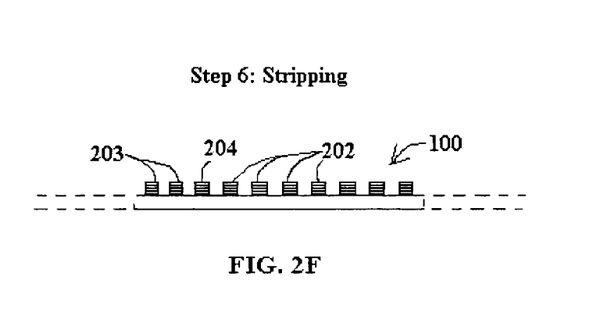

Referring to FIG. 2E, several layers of metals are then deposited on the upper surface of the exposed copper substrate to form a plurality of die attach pads 202, a plurality of contact pads 203 and a power/ground ring 204. Different deposition options are provided, as described in detail in the above-described embodiment. The photo-resist is then stripped and the structure is cleaned resulting in a pattern of die attach pads 202, contact pads 203, and power/ground ring 204, as shown in FIG. 2F.

Figure 2G:
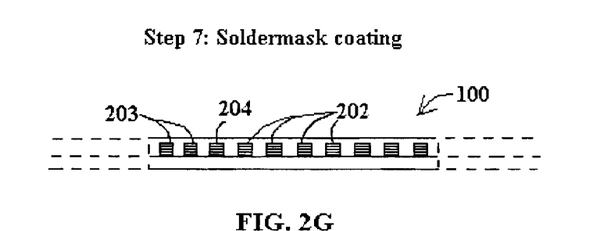

Next, the upper surface of the leadframe strip 100, including the die attach pads 202, contact pads 203, and power/ground ring 204, is coated with a layer of photo-imageable solder mask. The resulting solder mask layer can be thicker than the die attach pads 202, contact pads 203, and power/ground ring 204, as shown in FIG. 2G.

Figure 2H:
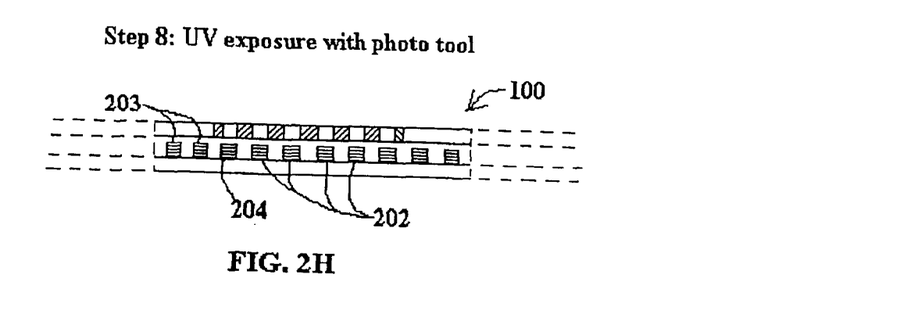
Figure 2I:
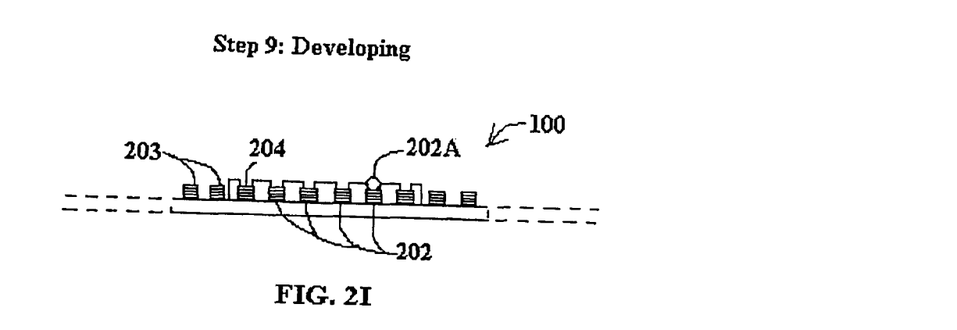

The layer of photo-imageable solder mask is then imaged by exposure to ultraviolet light using a photo-tool, as shown in FIG. 2H. The solder mask is subsequently developed, resulting in die attach pad slots 202A in the solder-mask that expose an upper surface of the die attach pads 202, as shown in FIG. 2I. The solder mask around the contact pads 203 can be fully exposed to ultraviolet light and developed, thus resulting in columns of contact pads 203 on the Cu substrate.

Figure 2J:
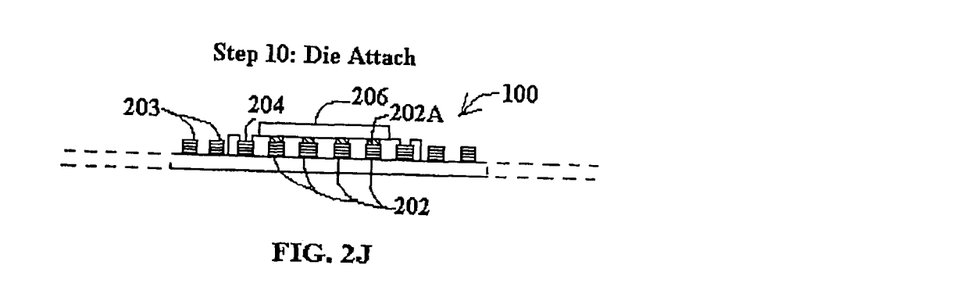

Referring now to FIG. 2J, a singulated semiconductor die 206 is conventionally mounted via epoxy (or other suitable means) to the plurality of die attach pads 202, in the die attach pad slots 202A and the epoxy is cured.

As in the above-described embodiment, gold wires 205 are then bonded between the semiconductor die 206 and the contact pads 203. The leadframe 100 is then molded using a modified mold with the bottom cavity being a flat plate, and subsequently cured. The leadframe 100 is then subjected to a final alkaline etching via full immersion which exposes an array of exposed contact pads 203, power/ground ring 204 and die attach pads 202.

Figure 2K:
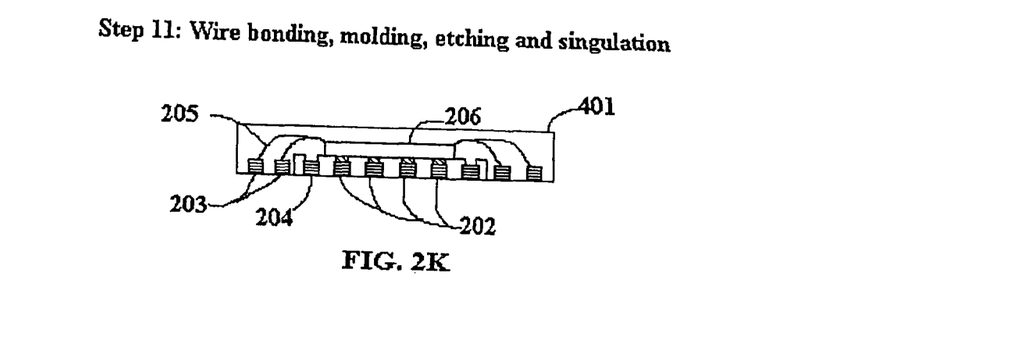

Singulation of the individual units from the full leadframe array strip 100 may then be performed either by saw singulation or die punching resulting in the final configuration of FIG. 2K.

Referring now to FIGS. 3A–3K, there is provided processing steps for manufacturing a LPCC with etch back and a plurality of die attach pads according to yet another embodiment of the present invention.

Steps 1 to 7 of FIGS. 3A to 3G are substantially identical to Steps 1 to 7 of FIGS. 2A to 2G as described above.

Figure 3A:
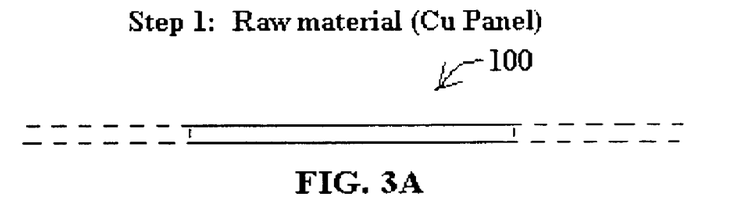
FIGS. 3A–3K show processing steps for manufacturing a Leadless Plastic Chip Carrier (LPCC) with etch back and a plurality of die attach pads according to yet another embodiment of the present invention.
Figure 3B:
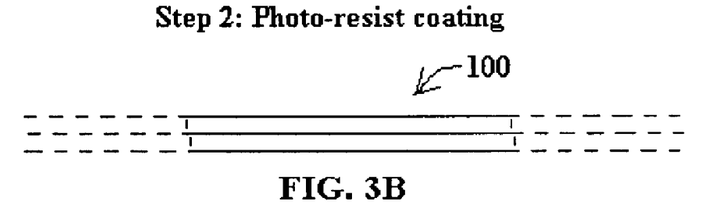
Figure 3C:
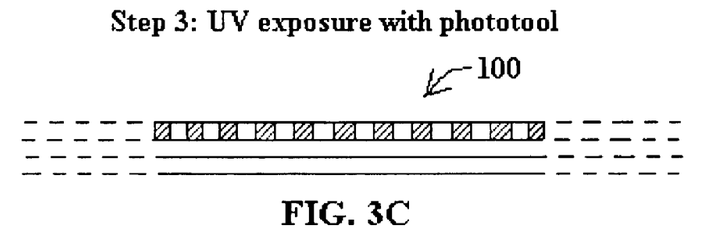
Figure 3D:
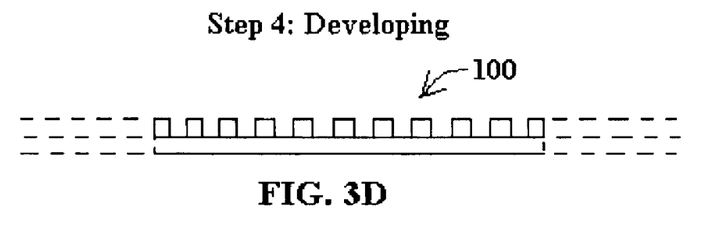
Figure 3E:
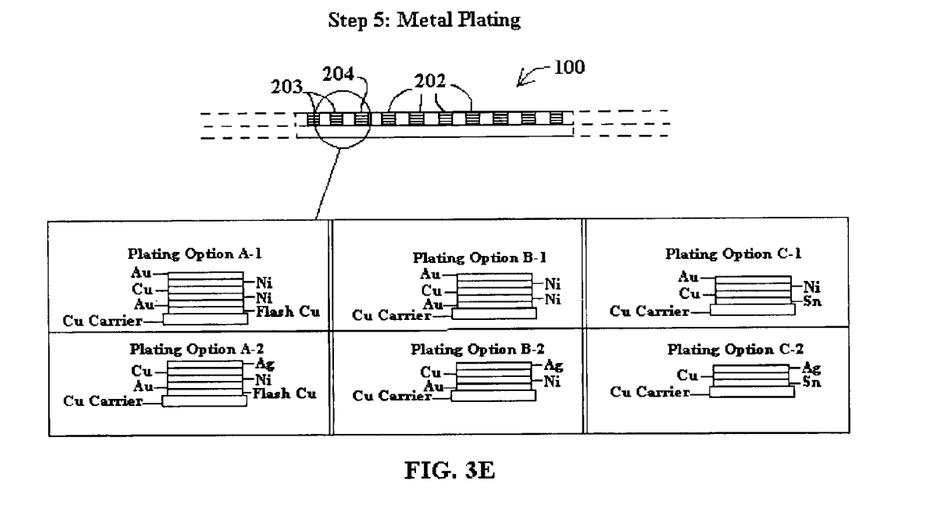
Figure 3F:
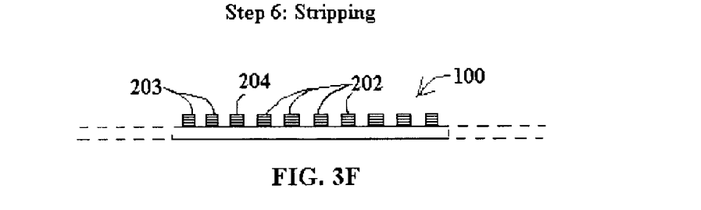
Figure 3G:
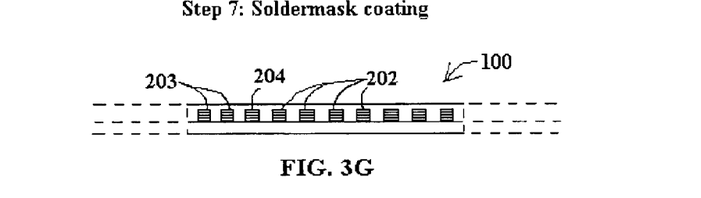
Figure 3H:
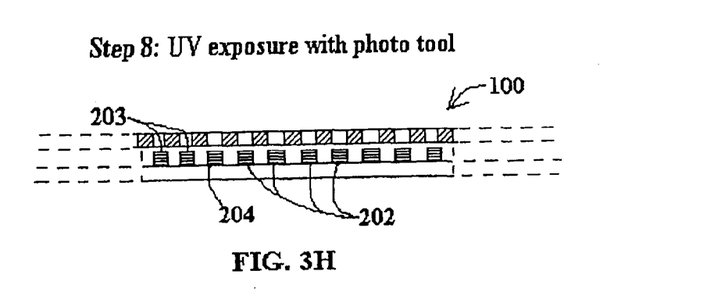
Figure 3I:
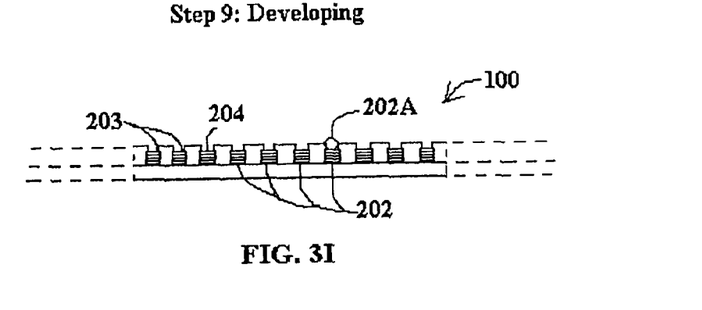

The layer of photo-imageable solder mask is then imaged by exposure to ultraviolet light using a photo-tool, as shown in FIG. 3H. The solder mask is subsequently developed, resulting in die attach pad slots 202A in the solder-mask that expose an upper surface of the die attach pads 202, as shown in FIG. 3I. Similarly, slots in the solder-mask expose the upper surface of the contact pads 203 and the power/ground ring 204. It will be understood that this embodiment differs from that shown in FIG. 2I as the solder-mask layer extends to the edges of the panel 100 in the present embodiment.

Figure 3J:
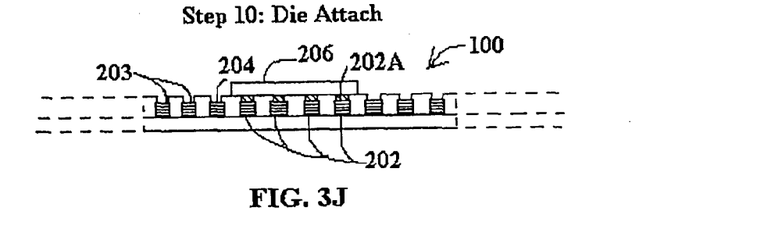

Referring now to FIG. 3J, a singulated semiconductor die 206 is conventionally mounted to the plurality of die attach pads 202, via epoxy (or other suitable means) in the die attach pad slots 202A and the epoxy is cured.

As described in the prior embodiments, gold wires 205 are then bonded between the semiconductor die 206 and the contact pads 203. The leadframe 100 is then molded using a modified mold with the bottom cavity being a flat plate, and subsequently cured. The leadframe 100 is then subjected to a final alkaline etching via full immersion which exposes an array of exposed contact pads 203, power/ground ring 204 and die attach pads 202.

Figure 3K:
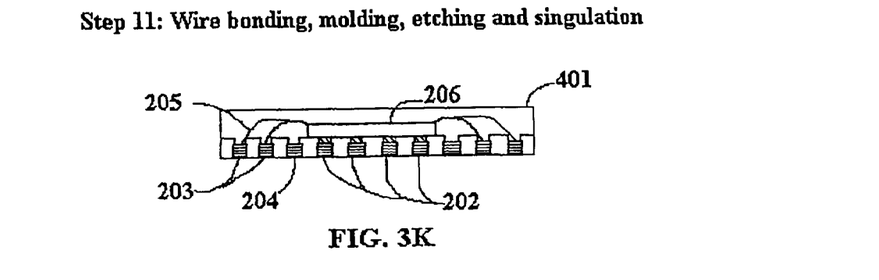

Singulation of the individual units from the full leadframe array strip 100 may then be performed either by saw singulation or die punching resulting in the final configuration of FIG. 3K.

Figure 4:
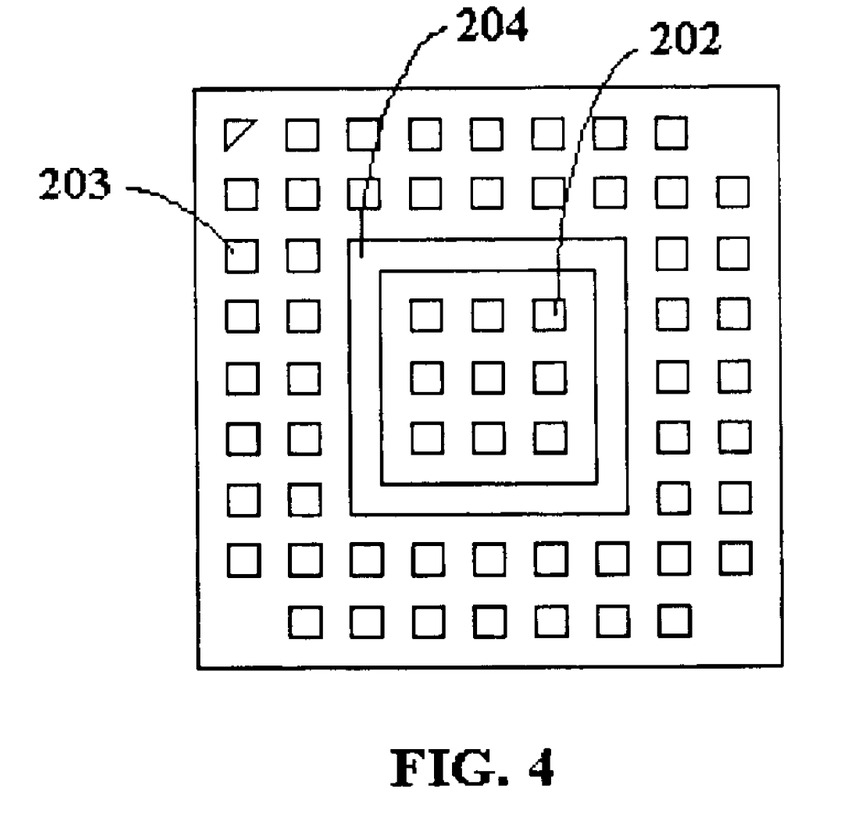
FIG. 4 is a bottom view of an IC package manufactured in accordance with an embodiment of the present invention.

FIG. 4 is a bottom plan view of the assembled IC package according to the present invention, with an array of rectangular die attach pads 202, contact pads 203 and power/ground ring 204. It is contemplated that the IC package can also have an array of round die attach pads 202, contact pads 203 and power/ground ring 204.

Other embodiments of the invention are possible. For example, the thickness of each of the metal layers deposited in step 5 of FIGS. 1E, 2E and 3E are given for exemplary purposes only and can vary, as will occur to those of skill in the art. All such embodiments are believed to be within the scope of the present invention as set forth in the claims appended hereto.

We claim:

1. A leadless plastic chip carrier comprising:
   a plurality of die attach pads;
   a semiconductor die mounted to said plurality of die attach pads;
   at least one row of contact pads circumscribing said plurality of die attach pads;
   a power/ground ring intermediate said at least one row of contact pads and said ground plane;
   a plurality of wire bonds connecting various ones of said semiconductor die, said contact pads and said power/ground ring; and
   an overmold covering said semiconductor die, said plurality of die attach pads, said power/ground ring and said contact pads such that each of said die attach pads and said contact pads has one exposed surface.

2. The leadless plastic chip carrier according to claim 1, wherein said plurality of die attach pads and said at least one row of contact pads comprise a plurality of metal layers.

3. The leadless plastic chip carrier according to claim 2, wherein each of said plurality of die attach pads are separated by a photo-imageable mask.

4. The leadless plastic chip carrier according to claim 2, wherein said plurality of metal layers comprises successive layers of Au, Ni, Cu, Ni and Au.

5. The leadless plastic chip carrier according to claim 2, wherein said plurality of metal lagers comprises successive layers of Au, Ni, Cu and Ag.

6. The leadless plastic chip carrier according to claim 2, wherein said plurality of metal layers comprises successive layers of Sn, Cu, Ni and Au.

7. The leadless plastic chip carrier according to claim 2, wherein said plurality of metal layers comprises successive layers of Sn, Cu, and Ag.

8. The leadless plastic chip carrier according to claim 1, wherein said plurality of die attach pads comprises an array of similarly sized pads.

9. The leadless plastic chip carrier according to claim 1, wherein said plurality of die attach pads, said at least one row of contact pads, and said power/ground ring comprises an array of similarly sized pads.

10. The leadless plastic chip carrier according to claim 9, wherein said array of similarly sized pads comprises an array of rectangular pads.

11. The leadless plastic chip carrier according to claim 10, wherein said array of similarly sized pads comprises an array of round pads.

12. The leadless plastic chip carrier according to claim 2, wherein said at least one row of contact pads is recessed from said photo-imageable mask in a plurality of etch-down cavities.

13. The leadless plastic chip carrier according to claim 12, further comprising a plurality of solder balls disposed in said each of said etch-down cavities.

* * * * *